United States Patent
Nam et al.

(10) Patent No.: US 8,470,697 B2
(45) Date of Patent: Jun. 25, 2013

(54) METHOD OF FORMING P-TYPE COMPOUND SEMICONDUCTOR LAYER

(75) Inventors: Ki Bum Nam, Ansan-si (KR); Hwa Mok Kim, Seoul (KR); James S. Speck, Santa Barbara, CA (US)

(73) Assignee: Seoul Opto Device Co., Ltd., Ansan-si ( * ) Notice: Subject to any disclaimer, the term of this patent is extended or adjusted under 35 U.S.C. 154(b) by 0 days.

(21) Appl. No.: 12/560,891

(22) Filed: Sep. 16, 2009

(65) Prior Publication Data

US 2010/0003810 A1 Jan. 7, 2010

Related U.S. Application Data

(63) Continuation of application No. 12/090,305, filed as application No. PCT/KR2007/003185 on Jun. 29, 2007, now Pat. No. 7,682,953.

(30) Foreign Application Priority Data

Jun. 30, 2006 (KR) .................. 10-2006-0060820
Jun. 30, 2006 (KR) .................. 10-2006-0060822

(51) Int. Cl.
 *H01L 21/00* (2006.01)
(52) U.S. Cl.
 USPC ............... 438/505; 438/22; 438/45; 438/518; 438/795; 438/46; 257/12; 257/96; 257/97; 257/101; 257/615
(58) Field of Classification Search
 None
 See application file for complete search history.

(56) References Cited

U.S. PATENT DOCUMENTS

| | | | |
|---|---|---|---|
| 5,306,662 A | 4/1994 | Nakamura et al. | |
| 6,476,420 B2 * | 11/2002 | Nikolaev et al. | 257/82 |
| 2002/0017650 A1 | 2/2002 | Nikolaev et al. | |
| 2004/0058465 A1 * | 3/2004 | Taki | 438/22 |
| 2005/0247952 A1 | 11/2005 | Huang | |

FOREIGN PATENT DOCUMENTS

| | | |
|---|---|---|
| JP | 06-326416 | 11/1994 |
| JP | 09-040490 | 2/1997 |
| JP | 09-199758 | 7/1997 |

(Continued)

OTHER PUBLICATIONS

Office Action dated Jul. 17, 2009 (for co-pending U.S. Appl. No. 12/090,305).

(Continued)

*Primary Examiner* — Julio J Maldonado
*Assistant Examiner* — Shantanu C Pathak
(74) *Attorney, Agent, or Firm* — H.C. Park & Associates, PLC

(57) ABSTRACT

A method of forming a p-type compound semiconductor layer includes increasing a temperature of a substrate loaded into a reaction chamber to a first temperature. A source gas of a Group III element, a source gas of a p-type impurity, and a source gas of nitrogen containing hydrogen are supplied into the reaction chamber to grow the p-type compound semiconductor layer. Then, the supply of the source gas of the Group III element and the source gas of the p-type impurity is stopped and the temperature of the substrate is lowered to a second temperature. The supply of the source gas of nitrogen containing hydrogen is stopped and drawn out at the second temperature, and the temperature of the substrate is lowered to room temperature using a cooling gas. Accordingly, hydrogen is prevented from bonding to the p-type impurity in the p-type compound semiconductor layer.

13 Claims, 7 Drawing Sheets

FOREIGN PATENT DOCUMENTS

| | | |
|---|---|---|
| JP | 2001-119065 | 4/2001 |
| JP | 2003-133649 | 5/2003 |
| JP | 2006-140530 | 6/2006 |
| KR | 10-2005-0025054 | 3/2005 |

OTHER PUBLICATIONS

German Office Action dated Oct. 30, 2012 issued for DE Patent Application No. 11 2007 000 059.7.

* cited by examiner

METHOD OF FORMING P-TYPE COMPOUND SEMICONDUCTOR LAYER

CROSS REFERENCE TO RELATED APPLICATIONS

This application is a continuation application of U.S. patent application Ser. No. 12/090,305, filed on May 8, 2008, which is the National Stage of International Application No. PCT/KR2007/003185, filed on Jun. 29, 2007, and claims priority from and the benefit of Korean Patent Application No. 10-2006-0060820, filed on Jun. 30, 2006, and Korean Patent Application No. 10-2006-0060822, filed on Jun. 30, 2006, which are all hereby incorporated by reference for all purposes as if fully set forth herein.

BACKGROUND OF THE INVENTION

1. Field of the Invention

The present invention relates to a method of forming a p-type compound semiconductor layer, and more particularly, to a method of forming an (Al, Ga, In)N-based compound semiconductor layer including p-type impurities (p-layer), which can simplify a semiconductor forming process.

2. Discussion of the Background (Al, Ga, In)N-based compound semiconductors are applied to compound semiconductor devices such as light emitting diodes (LEDs) or laser diodes (LDs). FIG. 1 is a longitudinal sectional view schematically showing a conventional (Al, Ga, In)N-based compound semiconductor device.

Referring to FIG. 1, an (Al, Ga, In)N-based compound semiconductor layer 13 including n-type impurities (n-layer), an active layer 15, and an (Al, Ga, In)N-based compound semiconductor layer (p-layer) 17 including p-type impurities are sequentially formed on a substrate 11.

These conventional (Al, Ga, In)N-based compound semiconductor layers are grown through processes such as metal organic chemical vapor deposition (MOCVD).

According to the MOCVD process, an (Al, Ga, In)N-based compound semiconductor layer is formed as follows. A source gas of a Group III element such as Al, Ga or In, and ammonia ($NH_3$) gas containing hydrogen and nitrogen are introduced into a reaction chamber, and an n-layer 13, an active layer 15 and a p-layer 17 are sequentially grown on the substrate 11 at a temperature of 900 to 1,200° C. When the p-layer 17 is formed by means of magnesium (Mg) doping or the like, the substrate 11 is cooled by lowering the temperature of the reaction chamber while stopping the introduction of the source gas of the Group III element but maintaining the introduction of the ammonia.

Meanwhile, a conventional (Al, Ga, In)N-based compound semiconductor device 10 secures conductivity by typically doping the p-layer 17 with, for example, magnesium (Mg). However, a p-type impurity such as magnesium (Mg) is easily bonded to hydrogen (H) contained in ammonia when the temperature of the reaction chamber is lowered as described above. Accordingly, there is a problem in that a p-type compound semiconductor layer has an increased resistance value since the function of the p-type impurity as an acceptor for providing free holes is deteriorated.

Therefore, an additional annealing process of decoupling hydrogen from the p-type impurity is performed in a process of forming a p-layer of an (Al, Ga, In)N-based compound semiconductor.

FIG. 2 is a flowchart illustrating a conventional method of forming a p-layer of an (Al, Ga, In)N-based compound semiconductor.

Referring to FIG. 2, a p-layer of a compound semiconductor is grown on a substrate by increasing the temperature of the substrate to 900 to 1,200° C. in a reaction chamber and supplying a p-type impurity, a Group III element and ammonia into the reaction chamber (S1). When the p-layer is grown, the substrate is cooled to room temperature by lowering the temperature of the reaction chamber while continuously supplying a source gas of nitrogen containing hydrogen into the reaction chamber and stopping the supply of the p-type impurity and a source gas of the Group III element (S2). When the substrate is cooled to room temperature, the substrate with the p-layer grown thereon is taken out from the reaction chamber (S3). Then, an annealing process is performed to lower a resistance value of the p-layer grown on the substrate (S4). Referring to U.S. Pat. No. 5,306,662, a p-layer of a compound semiconductor is grown using a p-type impurity, a Group III element and ammonia, and an annealing process of the p-layer is then performed at a temperature of 400° C. or more. As a result, hydrogen bonded to the p-type impurity existing in the p-layer is removed, thereby forming a p-type (Al, Ga, In)N-based compound semiconductor with a low resistance value.

In such a conventional (Al, Ga, In)N-based compound semiconductor device, at least one annealing process should be additionally performed to lower a resistance value of a p-layer. However, there is a problem in that the additional annealing process makes a compound semiconductor device forming process complicated and cumbersome.

Furthermore, according to the addition of the annealing process, time required for manufacturing a product increases, and expensive equipment especially for the annealing process should be purchased and a space for installing the equipment is needed, resulting in increased investment costs for manufacturing facilities.

Meanwhile, in order to solve such conventional problems, there has been proposed a method of cooling a substrate to room temperature while stopping supply of a p-type impurity, a Group III element and ammonia and lowering the temperature of a reaction chamber when growth of a p-layer is completed at a temperature of 900 to 1,200° C. within the reaction chamber.

However, this method has a problem in that the Group III element of Al, Ga or In and nitrogen are decomposed from the grown p-layer, causing severe damage to a surface of an (Al, Ga, In)N-based compound of the p-layer.

SUMMARY OF THE INVENTION

An object of the present invention is to provide a method of forming a p-type compound semiconductor layer, wherein bonding between a p-type impurity and hydrogen is blocked upon formation of the p-type compound semiconductor layer.

Another object of the present invention is to provide a method of forming a p-type compound semiconductor layer, wherein an additional annealing process is not needed by blocking bonding between a p-type impurity and hydrogen upon formation of the p-type compound semiconductor layer.

A further object of the present invention is to provide a method of forming a p-type compound semiconductor layer, wherein bonding between a p-type impurity and hydrogen is blocked and the p-type compound semiconductor layer is prevented from being damaged upon formation of the p-type compound semiconductor layer.

A method of forming a p-type compound semiconductor layer according to an aspect of the present invention comprises the step of increasing a temperature of a substrate loaded into a reaction chamber to a first temperature. Then, a source gas of a Group III element, a source gas of a p-type impurity and a source gas of nitrogen containing hydrogen are supplied into the reaction chamber so as to grow the p-type compound semiconductor layer. After the growth of the p-type compound semiconductor layer is completed, the supply of the source gas of the Group III element and the source gas of the p-type impurity is stopped and the temperature of the substrate is lowered to a second temperature. The supply of the source gas of nitrogen containing hydrogen is stopped at the second temperature. Thereafter, the temperature of the substrate is lowered to room temperature by supplying argon gas.

Therefore, since the supply of the source gas of nitrogen containing hydrogen is stopped in the state where the substrate is cooled to the second temperature, hydrogen is prevented from being bonded to the p-type impurity contained in the p-type compound semiconductor layer in the subsequent process of lowering the temperature of the substrate to room temperature.

At this time, the source gas of nitrogen containing hydrogen may be ammonia.

In addition, the second temperature may be in a range of 400 to 900° C.

Meanwhile, the p-type impurity may be magnesium (Mg).

In an embodiment, after the step of stopping the supply of the source gas of nitrogen containing hydrogen at the second temperature, the second temperature may be maintained for a predetermined period of time.

In an embodiment, after the step of stopping the supply of the source gas of nitrogen containing hydrogen at the second temperature, the source gas of nitrogen containing hydrogen remaining in the reaction chamber may be exhausted.

In an embodiment, before the step of stopping the supply of the source gas of nitrogen containing hydrogen at the second temperature, an ITO tunnel layer may be grown by supplying the source gas of the Group III element, a source gas of an n- or p-type impurity and the source gas of nitrogen containing hydrogen.

In an embodiment, when the growth of the ITO tunnel layer is completed at the second temperature, the second temperature may be maintained for a predetermined period of time.

Alternatively, when the growth of the ITO tunnel layer is completed at the second temperature, the source gas of nitrogen containing hydrogen remaining in the reaction chamber may be exhausted.

A method of forming a p-type compound semiconductor layer according to another aspect of the present invention comprises the step of increasing a temperature of a substrate loaded into a reaction chamber to a first temperature. Then, a source gas of a Group III element, a source gas of a p-type impurity and a source gas of nitrogen containing hydrogen is supplied into the reaction chamber so as to grow the p-type compound semiconductor layer. After the growth of the p-type compound semiconductor layer is completed, the supply of the source gas of the Group III element and the source gas of the p-type impurity is stopped and the temperature of the substrate is lowered to a second temperature. An ITO tunnel layer is grown by supplying the source gas of the Group III element, a source gas of an n- or p-type impurity and the source gas of nitrogen containing hydrogen. After the growth of the ITO tunnel layer is completed, the supply of the source gas of the Group III element and the source gas of the n- or p-type impurity is stopped. The temperature of the substrate is lowered to a third temperature, and the supply of the source gas of nitrogen containing hydrogen is stopped. Then, the temperature of the substrate is lowered to room temperature.

Here, the second temperature may be in a range of 400 to 900° C.

Meanwhile, the third temperature may be in a range of from 400 to 850° C.

In an embodiment, after the step of stopping the supply of the source gas of nitrogen containing hydrogen at the third temperature, the source gas of nitrogen containing hydrogen remaining in the reaction chamber may be exhausted.

According to embodiments of the present invention, it is possible to provide a method of forming a p-type compound semiconductor layer, wherein an additional annealing process is not needed by properly blocking bonding between a p-type impurity and hydrogen upon formation of a p-type compound semiconductor layer, so that a p-type compound semiconductor with a low resistance value can be formed without an annealing process.

According to the present invention, such an annealing process performed in a conventional method of forming a p-type semiconductor can be omitted, thereby simplifying a process of forming a compound semiconductor device and shortening the time required for forming the compound semiconductor device.

Furthermore, it is possible to prevent damage to crystals by cooling a substrate to a predetermined temperature after formation of a p-type compound semiconductor layer, and subsequently stopping supply of a nitrogen source gas containing hydrogen and maintaining the temperature for a certain period of time.

Moreover, since an ITO tunnel layer is formed within an identical chamber in the cooling process along with the process of forming a p-type compound semiconductor layer, it is possible to eliminate an annealing process that is performed in a conventional method of forming a p-type semiconductor, a process of forming a compound semiconductor device can be simplified, and time required for forming the compound semiconductor device can also be shortened.

In addition, it is possible to prevent damage to crystals by cooling a substrate to a predetermined temperature after formation of a p-type semiconductor layer, and subsequently forming an ITO tunnel layer, stopping supply of a nitrogen source gas containing hydrogen, and cooling the substrate.

DETAILED DESCRIPTION OF THE ILLUSTRATED EMBODIMENTS

Figure 1:
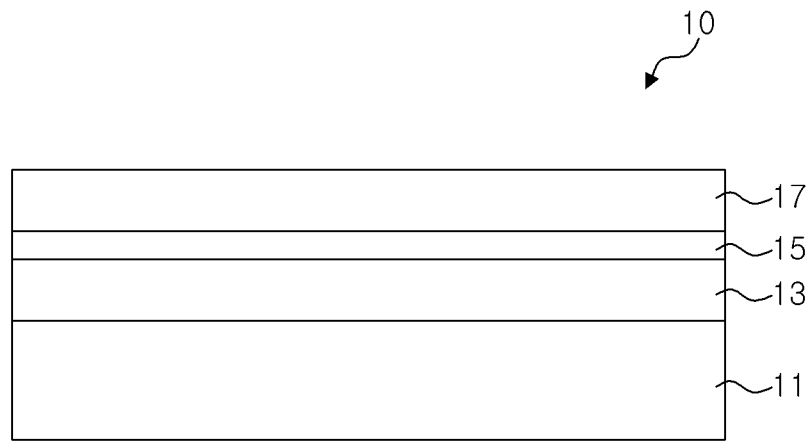
FIG. 1 is a longitudinal sectional view schematically showing a conventional (Al, Ga, In)N-based compound semiconductor.
Figure 2:
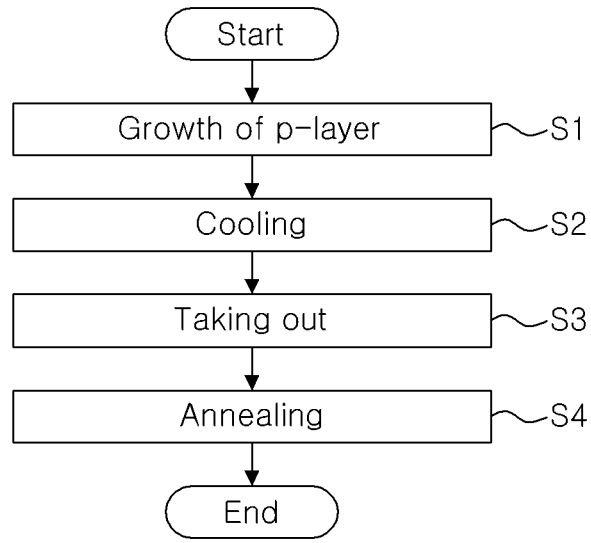
FIG. 2 is a flowchart illustrating a method of forming a p-layer of a conventional (Al, Ga, In)N-based compound semiconductor.

Hereinafter, preferred embodiments of the present invention will be described with reference to the accompanying drawings. The following embodiments are provided only for illustrative purposes to fully convey the scope of the present invention to those skilled in the art. Therefore, the present invention is not limited to the embodiments set forth herein but can be implemented in different forms. In the drawings, the widths, lengths, thicknesses and the like of components may be exaggerated for convenience of illustration. Like reference numerals indicate like elements throughout the specification.

Figure 3:
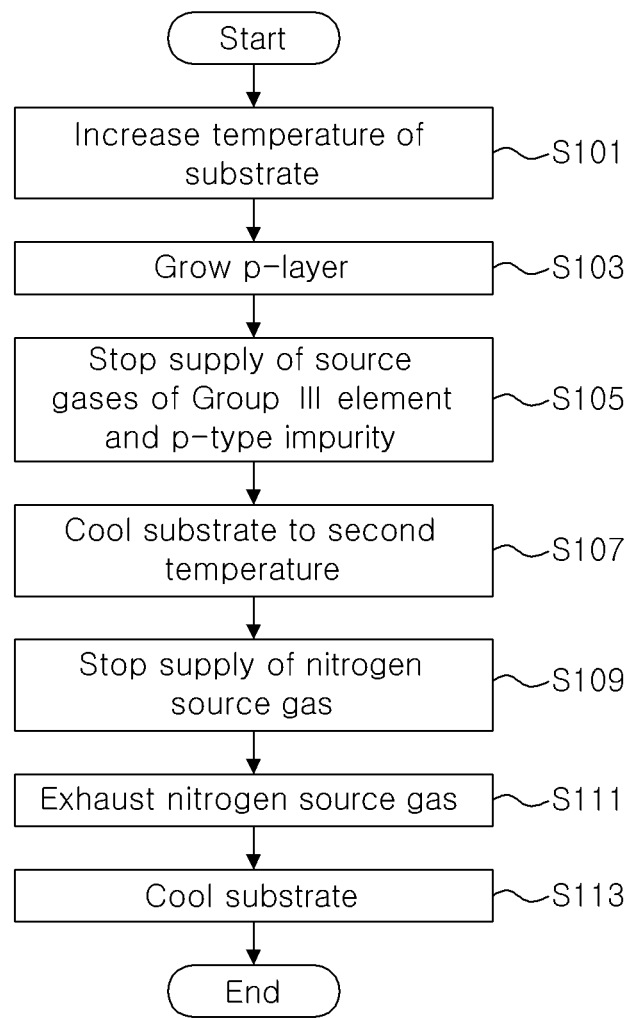
FIG. 3 is a flowchart illustrating a method of forming a p-type compound semiconductor layer according to a preferred embodiment of the present invention.
Figure 4:
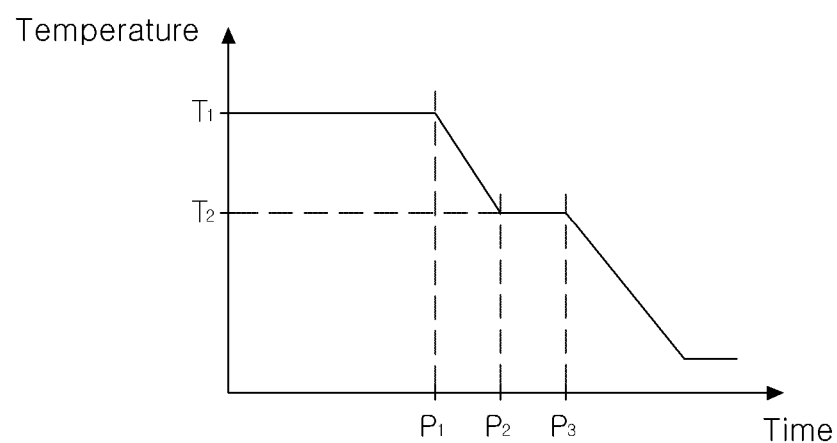
FIG. 4 is a graph schematically illustrating the method of forming the p-type compound semiconductor layer according to the preferred embodiment of the present invention.

FIG. 3 is a flowchart illustrating a method of forming a p-type compound semiconductor according to a preferred embodiment of the present invention, and FIG. 4 is a graph schematically illustrating the method of forming the p-type compound semiconductor according to the preferred embodiment of the present invention.

According to the preferred embodiment of the present invention, in order to form a nitride semiconductor of a Group III element, a substrate is loaded into a reaction chamber, and the temperature of the substrate is increased to a certain temperature ($T_1$) suitable for growing a nitride semiconductor layer of the Group III element (S101). The substrate is heated to the temperature ($T_1$), e.g., 1,050° C., to grow the nitride semiconductor layer of the Group III element.

Although an insulative material such as sapphire or silicone carbide (SiC) is used as the substrate, a conductive or semiconductive substrate may also be used as the substrate. Furthermore, a buffer layer is formed on the substrate to relieve lattice mismatch between such a heterogeneous substrate and the nitride semiconductor layer of the Group III element, and a nitride semiconductor layer of the Group III element doped with an n-type impurity, i.e., an n-type semiconductor layer, and an active layer are sequentially formed on the formed buffer layer. Such a buffer layer may be formed of AlN, InGaN, GaN, or AlGaN. Although the n-type semiconductor layer may be formed without doping of an impurity, it is desirable to form the n-type semiconductor layer by doping of an impurity such as Si, Ge, Se, S or Te.

The active layer is preferably formed in a single quantum well (SQW) structure or a multi quantum well (MQW) structure.

Next, a source gas of a Group III element, a source gas of a p-type impurity, and a source gas of nitrogen containing hydrogen, such as ammonia, are supplied into the reaction chamber to grow a p-type compound semiconductor layer (S103). For example, tri-methyl gallium (TMG) is used as the source gas of the Group III element, a gas containing hydrogen, such as ammonia, is used as the source gas of nitrogen (N). These source gases are supplied together with a carrier gas such as $H_2$ or $N_2$. Furthermore, if Mg is used as an impurity, for example, $Cp_2Mg$ is used as the source gas of the p-type impurity. In addition to Mg, it is possible to use Be, Sr, Ba, Zn or the like as the p-type impurity. Meanwhile, although it is mentioned above that the active layer is formed on the n-type semiconductor layer and the p-type compound semiconductor layer is grown on the active layer, this order may be interchangeable.

When the growth of the p-type compound semiconductor layer is completed, the supply of the source gas of the Group III element and the source gas of the p-type impurity is stopped (S105). Then, the substrate with the p-type compound semiconductor layer grown thereon is cooled to a predetermined temperature ($T_2$) (S107). The step of stopping the supply of the source gas of the Group III element and the source gas of the p-type impurity may be performed after or simultaneously with starting of the step of cooling the p-type compound semiconductor layer.

In the meantime, since the supply of the source gas of nitrogen containing hydrogen is still carried on in the gas supply stopping step, the temperature $T_2$ to which the p-type compound semiconductor layer is cooled is set as a high temperature at which bonding between hydrogen and the p-type impurity of the p-type compound semiconductor layer is not made in the present invention. Accordingly, since bonding between the p-type impurity and hydrogen contained in the nitrogen source gas is prevented while the step of cooling the p-type compound semiconductor layer is carried out, it is not necessary to perform an additional annealing process for removing hydrogen from the formed p-type compound semiconductor layer. The temperature $T_2$ to which the p-type compound semiconductor layer is cooled is set within a temperature range, for example, from 400 to 850° C. Since bonding between hydrogen and magnesium may occur at a temperature of 400° C. or less, it is not desirable to stop the supply of the source gas of nitrogen containing hydrogen, such as ammonia, at a temperature of 400° C. or less.

After the temperature of the substrate with the p-type compound semiconductor layer grown thereon is cooled to the predetermined temperature $T_2$, the supply of the source gas of nitrogen containing hydrogen is stopped (S109).

Then, the source gas of nitrogen remaining in the reaction chamber is exhausted to the outside (S111). Referring to FIG. 4, the step of exhausting the nitrogen source gas is performed for a predetermined period of time from $P_2$ to $P_3$, and the temperature $T_2$ of the substrate is consistently maintained during the period of time (from $P_2$ to $P_3$). This is to maintain the temperature of the substrate at least at a temperature equal to or higher than that at which a bonding reaction between the p-type impurity of the p-type compound semiconductor layer and hydrogen contained in the nitrogen source gas remaining in the reaction chamber can be blocked. However, it is not necessary to maintain the substrate at the constant temperature.

When the supply of the nitrogen source gas containing hydrogen is stopped and the nitrogen source gas containing hydrogen remaining in the reaction chamber is exhausted to the outside (at time point $P_3$), the substrate is cooled to a temperature, for example, to a room temperature (S113), where the substrate can be taken out from the reaction chamber.

Although the substrate may be cooled in a natural convection manner by stopping heating the substrate and leaving the substrate as it is, or the substrate may be cooled by air-cooling or water-cooling the reaction chamber, it is more desirable to cool the substrate by completely exhausting a gas remaining in the reaction chamber from the reaction chamber and injecting a cooling gas with a component that is not to be bonded to the p-type impurity, for example, nitrogen gas or argon gas, which is an inert gas, into the reaction chamber.

Figure 5:
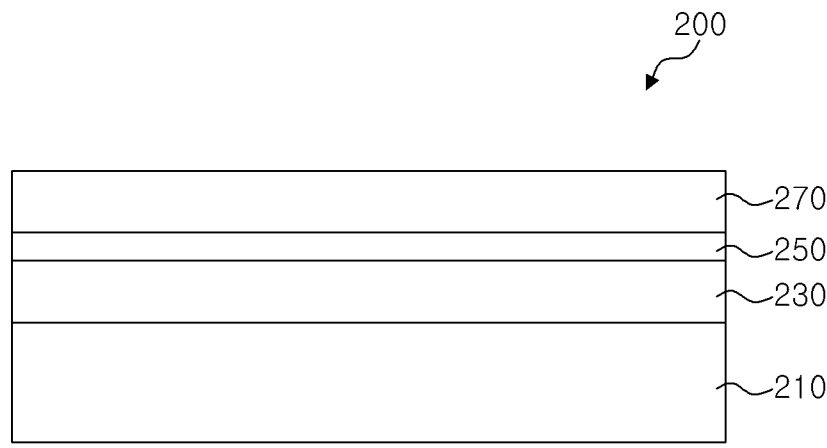
FIG. 5 is a longitudinal sectional view schematically showing an (Al, Ga, In)N-based compound semiconductor with the p-type compound semiconductor layer formed according to the preferred embodiment of the present invention.

FIG. 5 is a longitudinal sectional view schematically showing an (Al, Ga, In)N-based compound semiconductor with the p-type semiconductor formed according to the preferred embodiment of the present invention.

In an (Al, Ga, In)N-based compound semiconductor 200 according to this embodiment, an n-layer 230, an active layer 250 and a p-layer 270 are formed on a substrate 210. The substrate 210 may be formed of a conductive or semiconductive metal, Si, SiC, GaN or the like, and the substrate itself can perform the function of an n-type electrode. Alternatively, the substrate 210 may be formed of sapphire or spinel. A buffer layer (not shown) may be formed between the n-layer 230 and the substrate 210 as described above.

In this embodiment, the p-layer 270 that is a p-type compound semiconductor layer is formed without an annealing process as described above with reference to FIG. 3. To this end, when growth of the p-layer 270 is completed in a reaction chamber, supply of a source gas of a Group III element and a source gas of a p-type impurity is suspended, and after the substrate with the p-type compound semiconductor layer grown thereon is cooled to a predetermined temperature $T_2$, then supply of a nitrogen source gas is stopped. Here, the cooling temperature $T_2$ of the p-type compound semiconductor layer is set within a temperature range, for example, from 400 to 850° C. Subsequently, when the nitrogen source gas remaining in the reaction chamber is exhausted to the outside, the substrate is cooled using nitrogen ($N_2$) gas or argon (Ar) gas, which is an inert gas, to the extent where the substrate can be taken out from the reaction chamber, thereby forming the p-type compound semiconductor layer 270. The p-type compound semiconductor layer thus formed includes a p-type impurity that is not bonded to hydrogen. Accordingly, it is not necessary to perform an additional annealing process for removing hydrogen.

Meanwhile, although the embodiment in which the substrate 210 is disposed to be adjacent to the n-layer 230 is shown in FIG. 5, the present invention is not limited thereto but may be applied to a configuration in which the substrate is disposed to be adjacent to the p-layer. Even such a configuration also provides the same function and effects as the aforementioned and illustrated embodiment.

The (Al, Ga, In)N-based compound semiconductor described throughout the specification in connection with the present invention apparently includes $Al_xIn_yGa_{1-x-y}N$ (0≦x, y, x+y≦1), and such a compound semiconductor is applicable to various fields in addition to, for example, light emitting diodes (LEDs), laser diodes (LDs), hetero-junction bipolar transistors, field-effect transistors, and photodetectors.

Figure 6:
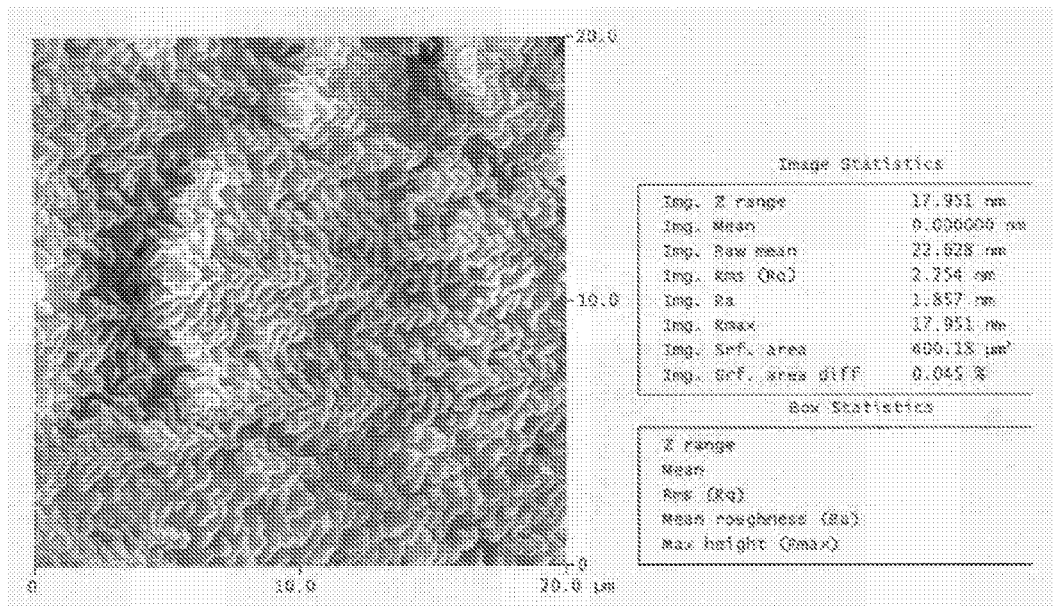
FIGS. 6 and 7 are views explaining effects of the method of forming the p-type compound semiconductor layer according to the preferred embodiment of the present invention.
Figure 7:
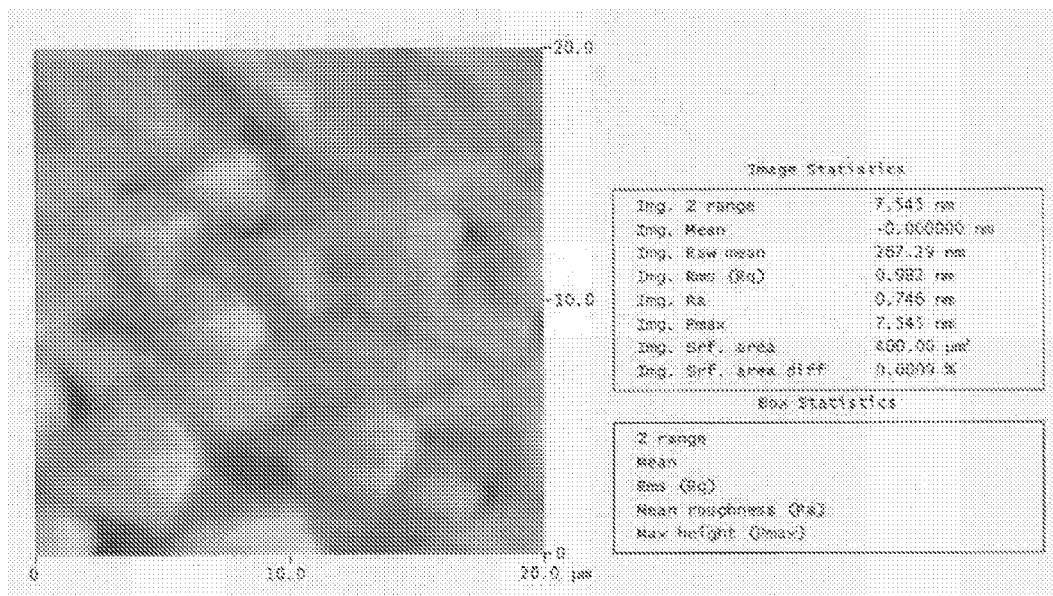

FIGS. 6 and 7 are views explaining effects of the method of forming the p-type compound semiconductor layer according to the preferred embodiment of the present invention and show atomic force microscope (AFM) images.

When the supply of ammonia gas is stopped just after the formation of the p-type semiconductor layer, Ga is evaporated due to rapid cooling, resulting in damage to a surface of the p-type semiconductor layer. FIG. 6 shows damage to a surface of a light emitting diode wafer due to such Ga evaporation.

However, in the method of forming the p-type compound semiconductor layer according to the preferred embodiment of the present invention, it is possible to prevent the substrate from being cooled abruptly and crystal structure from being damaged, by cooling the substrate to the predetermined temperature $T_2$ after the formation of the p-type semiconductor layer, suspending the supply of the nitrogen source gas containing hydrogen, and maintaining the temperature $T_2$ for a certain period of time.

FIG. 7 is an atomic force microscope image obtained by photographing a surface of a light emitting diode wafer formed by the method of forming the p-type compound semiconductor layer according to the present invention, wherein it can be seen that there is no damage to the surface of the wafer contrary to the surface of the wafer in FIG. 6.

Figure 8:
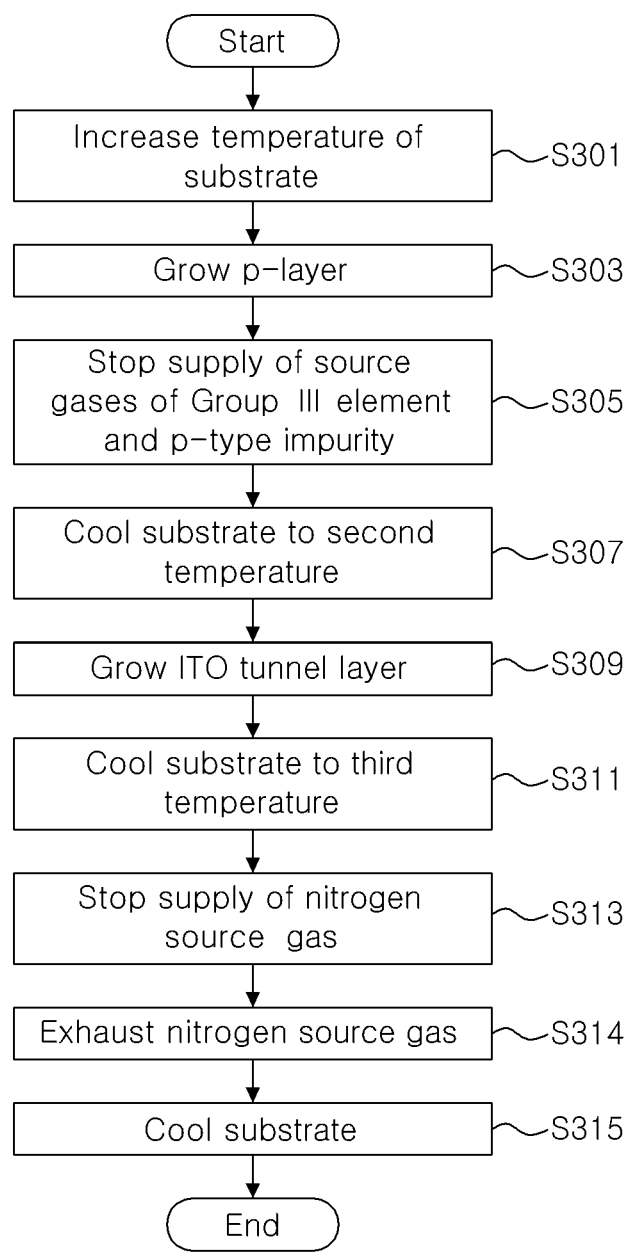
FIG. 8 is a flowchart illustrating a method of forming a p-type compound semiconductor layer according to another preferred embodiment of the present invention.
Figure 9:
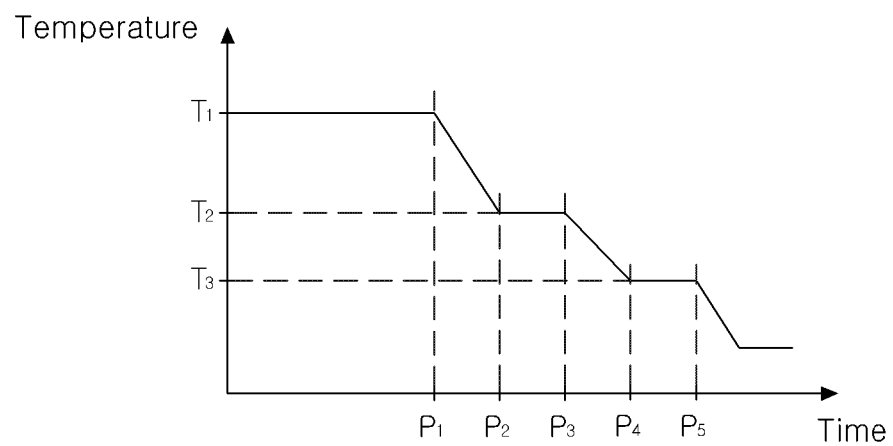
FIGS. 9 and 10 are graphs schematically explaining the method of forming the p-type compound semiconductor layer according to the other preferred embodiment of the present invention.
Figure 10:
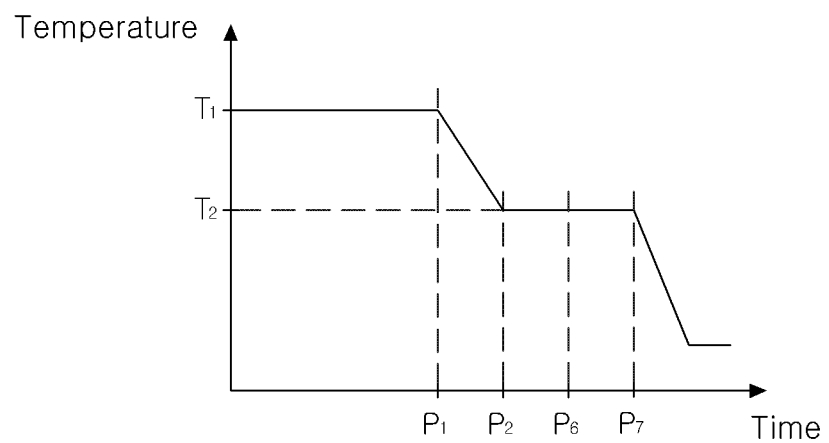

FIG. 8 is a flowchart illustrating a method of forming a p-type compound semiconductor layer according to another preferred embodiment of the present invention, and FIGS. 9 and 10 are graphs explaining the method of forming the p-type compound semiconductor layer according to the other preferred embodiment of the present invention.

Since some steps, including S301, S303, S305 and S307, in the preferred embodiment of the present invention shown in FIG. 8 are substantially similar to the steps of FIG. 3, including S101, S103, S105 and S107, descriptions thereof will be omitted.

When a substrate is cooled to a predetermined temperature $T_2$, a source gas of Group III elements, a source gas of an n- or p-type impurity, and a source gas of nitrogen containing hydrogen are supplied to grow an ITO tunnel layer (S309). The ITO tunnel layer is formed for ohmic contact between a p-type compound semiconductor layer and an ITO transparent electrode layer formed thereon, and can reduce electric resistance between the ITO transparent electrode layer and the p-type compound semiconductor layer and thus can reduce unintended interfacial heat generation caused by the electric resistance. The ITO tunnel layer can be formed by doping an (Al, Ga, In)N-based semiconductor layer with a high concentration of n- or p-type impurity.

In the meantime, since the ITO tunnel layer is grown in a temperature range of 400 to 900° C., the cooling temperature $T_2$ of the p-type compound semiconductor layer can be set in the temperature range. When the growth of the ITO tunnel layer is completed, the supply of the source gas of the Group III element and the source gas of the n- or p-type impurity is stopped.

Subsequently, the substrate is cooled to a predetermined temperature $T_3$ (S311), the supply of the source gas of nitrogen containing hydrogen is stopped (S313), and the source gas of nitrogen containing hydrogen remaining in a reaction chamber is exhausted to the outside (S314). In the present invention, the temperature $T_3$ to which the p-type compound semiconductor layer is cooled and at which the supply of the source gas of nitrogen containing hydrogen is stopped is set as a high temperature at which hydrogen is not to be bonded to the p-type impurity of the p-type compound semiconductor layer. Therefore, since bonding between the p-type impurity and hydrogen contained in the source gas of nitrogen is prevented while the step of cooling the p-type compound semiconductor layer is performed, it is not necessary to perform an additional annealing process for removing hydrogen from the formed p-type compound semiconductor layer.

The temperature $T_3$ to which the p-type compound semiconductor layer is cooled and at which the supply of the source gas of nitrogen containing hydrogen is stopped is set within a temperature range, for example, from 400 to 850° C. Since bonding between hydrogen and magnesium may occur at a temperature of 400° C. or less, it is not desirable to stop the supply of the source gas of nitrogen containing hydrogen, such as ammonia, at a temperature of 400° C. or less.

On the other hand, by causing the growth temperature $T_2$ of the ITO tunnel layer to be identical with the temperature $T_3$ in the step of stopping the supply of the source gas of nitrogen containing hydrogen, the supply of the source gas of nitrogen containing hydrogen may be stopped when the growth of the ITO tunnel layer is completed, the temperature $T_2$ may be maintained until the gas is exhausted from the reaction chamber, and the substrate may then be cooled.

Referring to FIG. 9, the growth of the ITO tunnel is performed at the predetermined temperature $T_2$ and when the substrate is then cooled to the predetermined temperature $T_3$, the step of exhausting the source gas of nitrogen containing hydrogen is performed for a certain period of time (from $P_4$ to $P_5$), while the temperature $T_2$ of the substrate is consistently maintained during the period of time (from $P_2$ to $P_3$). This is to maintain the temperature of the substrate at least at a temperature equal to or higher than that at which a bonding reaction between the p-type impurity of the p-type compound semiconductor layer and hydrogen contained in the nitrogen source gas remaining in the reaction chamber can be blocked. However, it is not necessary to maintain the substrate at the same temperature.

On the other hand, FIG. 10 exemplarily illustrates a case where the growth temperature $T_2$ of the ITO tunnel layer is forced to be identical with the temperature T3 at which the supply of the source gas of nitrogen containing hydrogen is stopped, wherein the ITO tunnel layer is grown for a predetermined period of time (from $P_2$ to $P_6$), the supply of the source gas of nitrogen containing hydrogen is stopped, and the temperature $T_2$ is consistently maintained for a predetermined time (from $P_6$ to $P_7$) until remaining gas is exhausted from the reaction chamber.

While the supply of the nitrogen source gas containing hydrogen is stopped and the nitrogen source gas containing hydrogen remaining in the reaction chamber is exhausted to the outside (at time point $P_5$ in FIG. 9 or time point $P_7$ of FIG. 10), the substrate is cooled to the extent that the substrate can be taken out from the reaction chamber, for example, to room temperature (S115). In this case, nitrogen gas may be used as a cooling gas.

Figure 11:
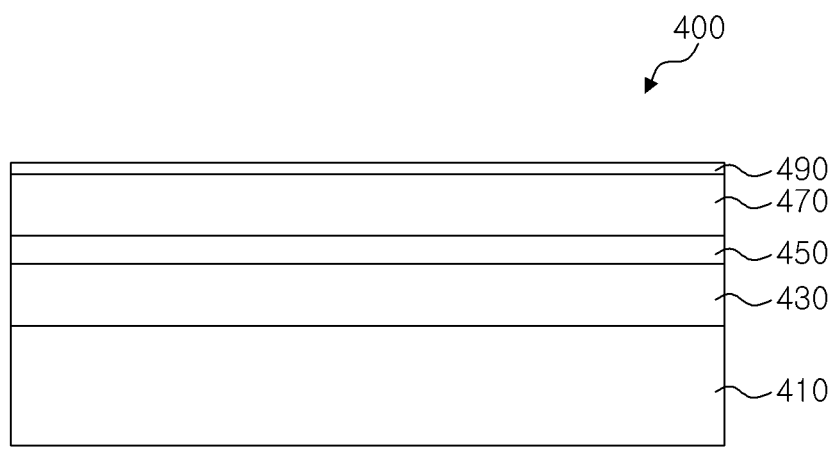
FIG. 11 is a longitudinal sectional view schematically showing an (Al, Ga, In)N-based compound semiconductor with the p-type compound semiconductor layer formed according to the other preferred embodiment of the present invention.

FIG. 11 is a longitudinal sectional view schematically showing an (Al, Ga, In)N-based compound semiconductor with the p-type compound semiconductor formed according to the other preferred embodiment of the present invention.

In an (Al, Ga, In)N-based compound semiconductor 400 according to this embodiment, an n-layer 430, an active layer 450, a p-layer 470 and an ITO tunnel layer 490 are formed on a substrate 410. The substrate 410 may be formed of a conductive or semiconductive metal, Si, SiC, GaN or the like, and the substrate itself can perform the function of an n-type electrode. Alternatively, the substrate 410 may be formed of sapphire or spinel. A buffer layer (not shown) may be formed between the n-layer 430 and the substrate 410 as described above.

In this embodiment, the p-layer 470 that is a p-type compound semiconductor layer is formed without an annealing process as described above with reference to FIG. 8. To this end, when the growth of the p-layer 470 is completed in a reaction chamber, supply of a source gas of a Group III element and a source gas of a p-type impurity is stopped, the substrate with the p-type compound semiconductor layer grown thereon is cooled to the predetermined temperature $T_2$, the ITO tunnel layer 490 is grown and then cooled at the same temperature $T_2$ or to the predetermined temperature $T_3$ as described above, and the supply of the nitrogen source gas containing hydrogen is then stopped. Here, the growth temperature $T_2$ of the ITO tunnel layer 490 is set in a temperature range, for example, from 400 to 900° C., while the temperature $T_3$ at which the supply of the source gas of nitrogen containing hydrogen is stopped is set from 400 to 850° C.

Therefore, by forcing the two temperatures to be identical with each other, the growth of the ITO tunnel layer 490 is completed, then the supply of the source gas of nitrogen containing hydrogen may be stopped, the temperature of the substrate may be maintained for a predetermined period of time, and the substrate may be cooled. Subsequently, after the nitrogen source gas containing hydrogen remaining in the reaction chamber is exhausted to the outside, the substrate is cooled to the extent that the substrate can be taken out from the reaction chamber. The p-type compound semiconductor layer thus formed includes a p-type impurity that is not bonded to hydrogen. Accordingly, it is not necessary to perform an additional annealing process for removing hydrogen.

Meanwhile, although the embodiment in which the substrate 410 is disposed to be adjacent to the n-layer 430 is shown in FIG. 11, the present invention is not limited thereto but may be applied to a configuration in which the substrate is disposed to be adjacent to the p-layer. Even such a configuration also provides the same function and effects as the aforementioned and illustrated embodiment.

The (Al, Ga, in)N-based compound semiconductor described throughout the specification in connection with the present invention apparently includes $Al_xIn_yGa_{1-x-y}N$ ($0 \leq x$, $y$, $x+y \leq 1$), and such a compound semiconductor is applicable to various fields in addition to, for example, light emitting diodes (LEDs), laser diodes (LDs), hetero-junction bipolar transistors, field-effect transistors, and photodetectors.

What is claimed is:

1. A method of forming a p-type compound semiconductor layer, the method comprising the steps of:
   heating a substrate in a reaction chamber to a first temperature;
   supplying a source gas of a Group III element, a source gas of a p-type impurity, and source gas of nitrogen containing hydrogen into the reaction chamber to grow the p-type compound semiconductor layer;
   after the growth of the p-type compound semiconductor layer is completed, stopping the supply of the source gas of the Group III element and the source gas of the p-type impurity, and lowering the temperature of the substrate to a second temperature, while maintaining the supply of the source gas of nitrogen containing hydrogen;
   after lowering the temperature of the substrate to the second temperature, stopping the supply of the source gas of nitrogen containing hydrogen at the second temperature while the p-type compound semiconductor layer is exposed;
   exhausting the source gas of nitrogen containing hydrogen remaining in the reaction chamber; and
   lowering the temperature of the substrate to a room temperature.

2. The method as claimed in claim 1, wherein the source gas of nitrogen containing hydrogen is ammonia.

3. The method as claimed in claim 1, wherein the second temperature is in a range of 400 to 900° C.

4. The method as claimed in claim 1, wherein the p-type impurity is magnesium (Mg).

5. The method as claimed in claim 1, further comprising:
   after the stopping the supply of the source gas of nitrogen containing hydrogen at the second temperature, maintaining the second temperature for a predetermined period of time.

6. The method as claimed in claim 1, wherein no other source gas besides the source gas of nitrogen containing hydrogen is supplied in the reaction chamber after forming the p-type compound semiconductor layer and before exhausting the source gas of nitrogen containing hydrogen remaining in the reaction chamber.

7. The method as claimed in claim 1, wherein the stopping of the supply of the source gas of the Group III element and the source gas of the p-type impurity is performed after or simultaneously with beginning to lower the temperature of the substrate to the second temperature.

8. The method as claimed in claim 1, wherein only the source gas of nitrogen containing hydrogen is supplied in the reaction chamber after the temperature of the substrate has been lowered to the second temperature and before exhausting the source gas of nitrogen containing hydrogen remaining in the reaction chamber.

9. The method as claimed in claim 1, wherein forming the p-type compound semiconductor layer takes place entirely in a single reactor.

10. The method as claimed in claim 1, wherein after lowering the temperature to the second temperature, the temperature is not raised before lowering the temperature to room temperature.

11. A method of forming a p-type compound semiconductor layer, the method comprising:

forming an n-type layer on a substrate and an active layer on the n-type layer, in a reaction chamber, using metal organic chemical vapor deposition (MOCVD);

heating the substrate in the reaction chamber to a first temperature;

supplying a source gas of a Group III element, a source gas of a p-type impurity, and a source gas of nitrogen containing hydrogen into the reaction chamber to grow the p-type compound semiconductor layer on the active layer;

after the growth of the p-type compound semiconductor layer is completed, stopping the supply of the source gas of the Group III element and the source gas of the p-type impurity, and lowering the temperature of the substrate to a second temperature, while maintaining the supply of the source gas of nitrogen containing hydrogen;

after lowering the temperature of the substrate to the second temperature, stopping the supply of the source gas of nitrogen containing hydrogen, while the p-type compound semiconductor layer is exposed;

exhausting the source gas of nitrogen containing hydrogen remaining in the reaction chamber; and lowering the temperature of the substrate to room temperature, wherein no source gas other than the source gas of nitrogen containing hydrogen is supplied to the reaction chamber during the lowering of the temperature of the substrate to the second temperature after forming the p-type semiconductor layer and before the exhausting of the source gas of nitrogen containing hydrogen.

12. The method as claimed in claim 11, wherein the lowering of the temperature comprises supplying argon gas (Ar) or nitrogen gas ($N_2$).

13. The method as claimed in claim 11, wherein after lowering the temperature to the second temperature, the temperature is not raised before lowering the temperature to room temperature.

* * * * *